United States Patent [19]

Sonobe et al.

[11] Patent Number: 5,162,633

[45] Date of Patent: Nov. 10, 1992

[54] MICROWAVE-EXCITED PLASMA PROCESSING APPARATUS

[75] Inventors: Tadasi Sonobe, Iwaki; Kazuo Suzuki, Hitachi; Takuya Fukuda, Hitachi; Michio Ohue, Hitachi, all of Japan

[73] Assignees: Hitachi, Ltd., Tokyo; Hitachi Engineering and Services Co., Ltd., Ibaraki, both of Japan

[21] Appl. No.: 372,716

[22] Filed: Jun. 27, 1989

[30] Foreign Application Priority Data

Jun. 29, 1988 [JP]  Japan ................ 63-159218

[51] Int. Cl.⁵ .................................. H05B 1/02
[52] U.S. Cl. ................... 219/121.43; 219/121.44; 156/646; 156/345; 204/298.37
[58] Field of Search ........ 219/121.4, 121.44, 121.43; 156/696, 643, 345; 315/111.21, 111.41; 204/298.37, 298.38

[56] References Cited

U.S. PATENT DOCUMENTS

| | | | |
|---|---|---|---|
| 4,433,228 | 2/1984 | Nishimatsu et al. | 219/121.43 |
| 4,492,610 | 1/1985 | Okano et al. | 204/298.38 |
| 4,630,566 | 12/1986 | Asmusser et al. | 315/111.41 |
| 4,716,340 | 12/1987 | Lee et al. | 315/111.41 |
| 4,740,268 | 4/1988 | Buckman | 204/298.37 |
| 4,745,337 | 5/1988 | Pichot et al. | 219/121.43 |
| 4,776,918 | 10/1988 | Otsubo et al. | 156/643 |
| 4,778,561 | 10/1988 | Ghanbari | 156/345 |
| 4,806,829 | 2/1989 | Nakao | 315/111.41 |
| 4,829,215 | 5/1989 | Kim et al. | 204/298.37 |
| 4,891,095 | 2/1990 | Ishida et al. | 204/298.38 |

FOREIGN PATENT DOCUMENTS

| | | | |
|---|---|---|---|
| 0251567 | 1/1988 | European Pat. Off. | 204/298.37 |
| 0039521 | 2/1986 | Japan | 204/298.37 |
| 0087869 | 5/1986 | Japan | 204/298.17 |
| 60-202942 | 6/1986 | Japan . | |
| 60-284098 | 12/1986 | Japan . | |
| 0089663 | 4/1988 | Japan | 204/298.17 |

*Primary Examiner*—Mark H. Paschall
*Attorney, Agent, or Firm*—Antonelli, Terry, Stout & Kraus

[57] ABSTRACT

The present invention relates to a plasma treatment apparatus for making plasma surface processing of a specimen such as thin-film formation, etching, sputtering or plasma oxidation by use of plasma produced through microwave discharge. In a specimen chamber provided with a specimen table for holding at least one specimen thereon, a microwave is introduced from a direction intersecting a magnetic line of force so as to propagate in the longitudinal direction of an ECR region or in a direction along the plane of the ECR region. Since the microwave is introduced from the transverse direction of the specimen chamber, the provision of a microwave introducing window at an upper portion of the specimen chamber is not required and hence a counter electrode for applying an electric field to the specimen can be disposed at the upper portion of the specimen chamber, thereby making it possible to apply a uniform electric field to the specimen so that the specimen is subjected to a uniform treatment.

36 Claims, 16 Drawing Sheets

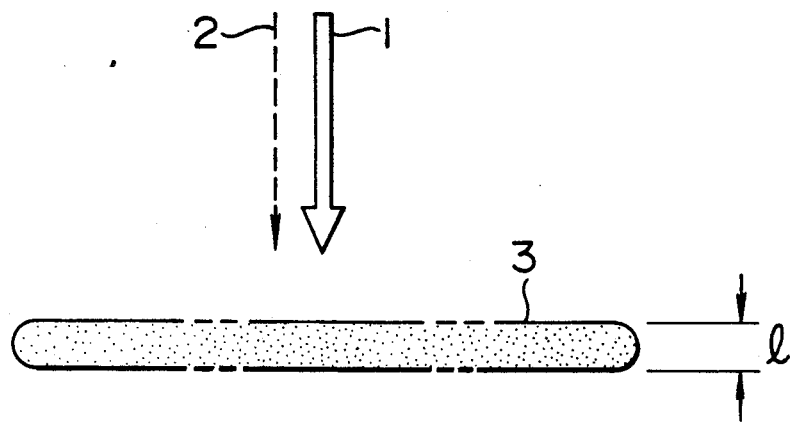
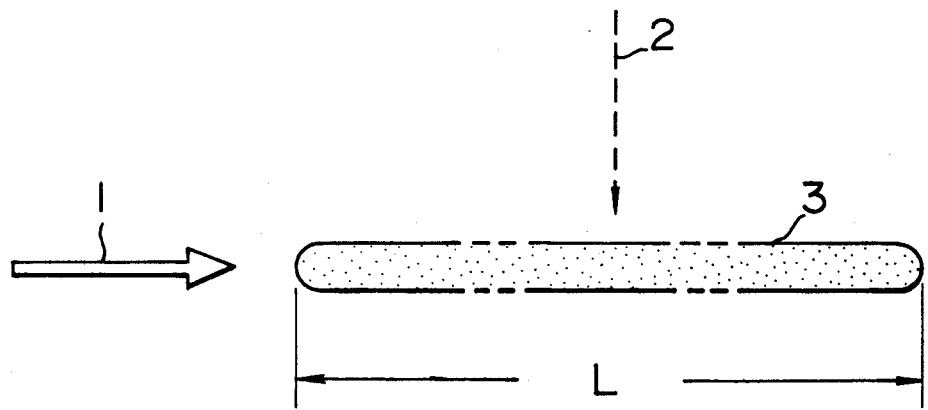

MICROWAVE-EXCITED PLASMA PROCESSING APPARATUS

BACKGROUND OF THE INVENTION

The present invention relates to a plasma processing apparatus, and more particularly to a plasma processing apparatus suitable for plasma surface treatment of a specimen such as thin-film formation, etching, sputtering or plasma oxidation using plasma produced through microwave discharge. The disclosure of the present invention presented here will be made in conjunction with the formation of a thin film on the surface of a specimen by way of example.

The conventional techniques concerning a microwave plasma processing apparatus are disclosed by, for example, JP-A-60-202942 and JP-A-61-284098.

A plasma processing apparatus according to the prior art disclosed by the JP-A-60-202942 is constructed such that the direction of introduction of a microwave and the direction of a magnetic line of force coincide with each other. The conventional plasma processing apparatus having such a construction will now be explained by virtue of the accompanying drawings.

FIG. 1 is a view for explaining the principle of the conventional plasma processing apparatus, and FIG. 2 is a cross section showing the construction of the conventional plasma processing apparatus. In FIGS. 1 and 2, reference numeral 1 designates a microwave, numeral 2 a magnetic line of force, numeral 3 an electron cyclotron resonance (hereinafter referred to as ECR) region, numeral 4 a waveguide, numeral 5 a microwave introducing window, numeral 6 a specimen chamber, numeral 7 a specimen, numeral 8 specimen table, numeral 9 a gas, numeral 10 a vacuum exhaust pipe, and numeral 11 magnetic field generating means.

A magnetic line of force generated by the magnetic field generating means in the conventional plasma processing apparatus is a spreading magnetic field the strength of which becomes gradually weak along the direction of propagation of a microwave. As shown in FIG. 1, in the magnetic line of force and in the course of the propagation path of the microwave is produced a thin ECR region the longitudinal direction or plane of which is orthogonal to the magnetic line of force and the direction of propagation of the microwave. More particularly, as shown in FIG. 2, the conventional plasma processing apparatus comprises the specimen chamber 6 which is vacuum-exhausted by an exhaust device (not shown) through the vacuum exhaust pipe 10, a microwave introducing means which includes the waveguide 4 for guiding the microwave 1 and the microwave introducing window 5 formed at an upper portion of the specimen chamber 6 for introducing the guided microwave into the specimen chamber 6, and the magnetic field generating means 11 which is provided outside the specimen chamber 6 for generating the magnetic line of force 2 to produce an ECR. The specimen table 8 for holding thereon the specimen 7 to be treated is placed in the specimen chamber 6. The specimen chamber 6 is constructed such that the gas 9 necessary for the treatment of the specimen 7 can be introduced into the specimen chamber 6. In the plasma processing apparatus thus constructed, the ECR region 3 is generated in a space above the specimen 7 and plasma produced in the ECR region 3 reaches a surface of the specimen 7 so that the specimen 7 is subjected to a predetermined treatment.

The above-mentioned conventional plasma processing apparatus has a problem that the efficiency of absorption efficiency of the microwave energy in the ECR region 3 is poor since the depth or thickness 1 of the ECR region 3 generated by virtue of the magnetic line of force 2 is very small and the microwave 1 progresses in the direction of the depth 1 of the ECR region. Also, in the case where it is desired to apply an electric field of an RF power source to the specimen table 8 and if a counter electrode is provided at the introducing side of the microwave of the microwave introducing window 5 above the specimen 7, the energy of the microwave 1 is inconveniently intercepted by the counter electrode and a pattern of the counter electrode appears on a film formed on the specimen 7 since the microwave introducing window 5 is provided at an upper portion of the specimen chamber 6 or above the specimen 7. Accordingly, it is not possible to uniformly extend the counter electrode above the specimen 7. Therefore, the conventional plasma processing apparatus involves a problem that it is not possible to have the AC electric field uniformly act on the specimen 7 to a desired uniform treatment, for example, a film formed on the surface of the specimen 7 has a non-uniform thickness distribution.

A plasma processing apparatus according to the prior art disclosed by the JP-A-61-284098 includes a transverse magnetic field type of microwave plasma discharge device in which a microwave to be introduced into a plasma generating chamber is made orthogonal to a magnetic line of force. However, in the JP-A-61-284098 there is an ECR region in the plasma generating chamber, and the generated plasma is led to a specimen chamber and thereby a thin film is formed. There is a problem that as there is the ECR region in the plasma generating chamber far from a specimen table, ions and radicals are lost during the plasma transmission. Therefore, the formation of a thin film on the surface of a specimen by virtue of radicals and ions cannot be effected.

SUMMARY OF THE INVENTION

A main object of the present invention is to provide a plasma processing apparatus in which the efficiency of absorption of the energy of a microwave in an ECR region is high and it is possible to apply a uniform electric field to a specimen.

Another object of the present invention is to improve the through-put in a plasma treatment.

The above objects of the present invention can be achieved by introducing a microwave from a direction intersecting a magnetic line of force so that the microwave is propagated in the longitudinal direction of an ECR region or in a direction along the plane of the ECR region. By propagating the microwave in the direction along the plane of the ECR region, it is possible to improve the efficiency of absorption of the energy of the microwave in the ECR region. Also, in this case, since the microwave is introduced from the transverse direction of a specimen chamber, the provision of a microwave introducing means at an upper portion of the specimen is not required and hence a counter electrode for applying an electric field to a specimen can be placed at the upper portion of the specimen, thereby making it possible to apply a uniform electric field to the specimen so that the specimen is subjected to a uniform treatment.

According to one aspect of the present invention, in order to improve the through-put in the plasma treatment a microwave, magnetic field generating means and a specimen table are arranged so that a plurality of specimens held on one surface of the specimen table can be plasma-treated simultaneously or at a time.

According to another aspect of the present invention, microwaves are introduced from substantially symmetrical with respect to the planes of specimens on a specimen table and magnetic field generating means is disposed so as to provide a similar symmetry to the gradient of a magnetic field.

According to a further aspect of the present invention, one specimen table is disposed in the central portion of plasma generated by a microwave and magnetic field generating means so that the plasma acts on specimens which are placed on opposite surfaces of the specimen table.

According to a still further aspect of the present invention, two specimen tables are disposed in oppositely to each other with plasma interposed therebetween so that specimens on the opposing surfaces of the specimen tables facing the plasma are subjected to a plasma treatment at a time.

According to the present invention, an ECR region is formed near a specimen in a specimen chamber, thereby making it possible to form a thin film of high quality by virtue of radicals and ions.

BRIEF DESCRIPTION OF THE DRAWINGS

FIG. 1 is a view for explaining the principle of the conventional plasma processing apparatus;

FIG. 3 is a view for explaining the principle of the present invention;

DESCRIPTION OF THE PREFERRED EMBODIMENTS

Preferred embodiments of the present invention will now be explained in detail by virtue of the accompanying drawings.

Figure 4:
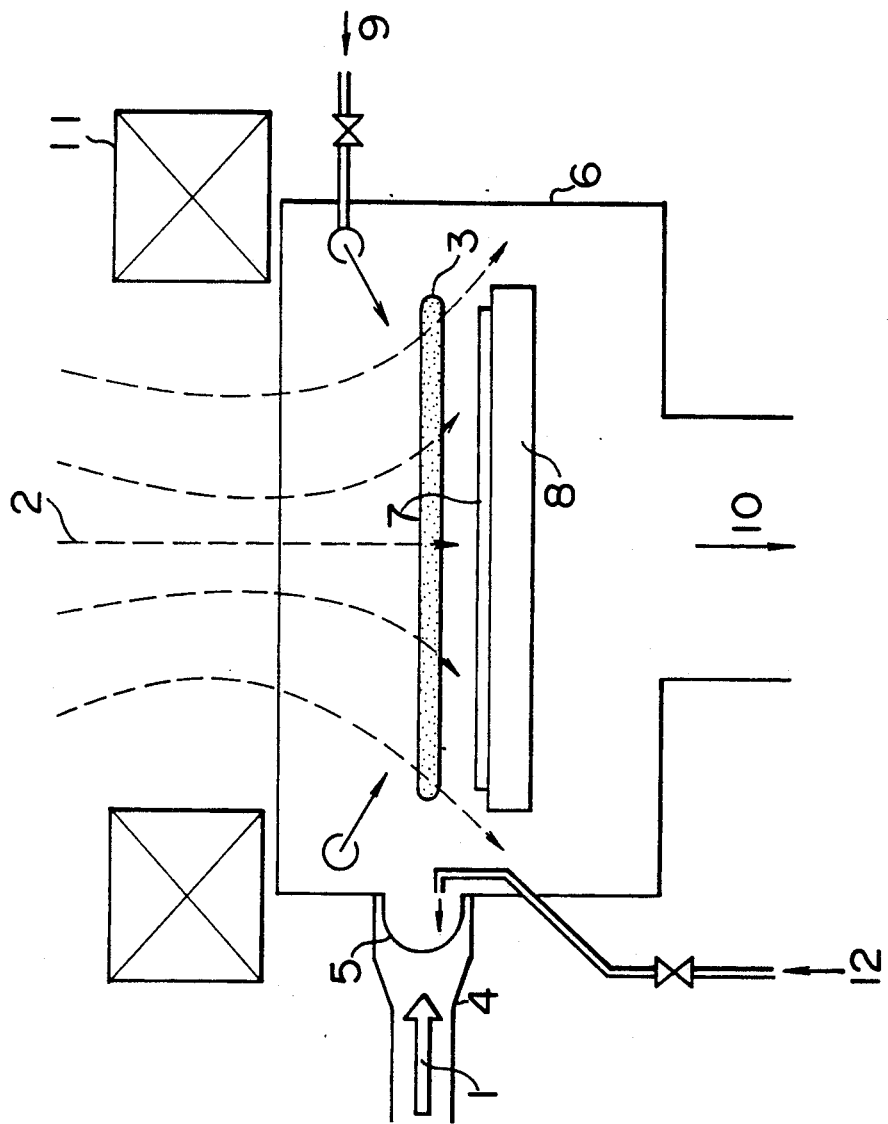
FIG. 4 is a cross section showing the construction of a plasma processing apparatus according to a first embodiment of the present invention.

FIG. 3 is a view for explaining the principle of the present invention, and FIG. 4 is a cross section showing the construction of a plasma processing apparatus according to a first embodiment of the present invention. In FIG. 4, reference numeral 12 designates a gas. The remaining reference numerals shown in FIGS. 3 and 4 are the same as the reference numerals shown in FIGS. 1 and 2.

Basically, the plasma processing apparatus according to the present invention is constructed such that a microwave 1 is introduced from a direction along the length L of the plane of an ECR region 3 produced by a magnetic line of force 2 generated by magnetic field generating means 11 so as to propagate along the direction of the plane length L, as shown in FIG. 3. Accordingly, the direction of the magnetic line of force 2 and the direction of propagation of the microwave 1 are substantially orthogonal to each other.

The above-mentioned orthogonal relation between the direction of the magnetic line of force 2 and the direction of propagation of the microwave 1 is attained in the first embodiment of the present invention by providing a microwave introducing window 5 and a waveguide 4 as microwave introducing means on the side of a specimen chamber 6. In that case, the microwave introducing window 5 and the waveguide 4 are placed in alignment with a position of the ECR region 3 in the direction of thickness thereof above a specimen 7.

In the first embodiment of the present invention, the kinds of first and second gases 12 and 9 introduced are different depending on the type of a treatment to be made to the specimen 7 by the plasma treatment apparatus. For example, when an $SiO_2$ film is to be formed on the specimen 7, an oxygen ($O_2$) and a silane ($SiH_4$) gas may be used as the first and second gases 12 and 9, respectively. Also, when etching is to be made to the specimen 7, a single gas causing the generation of plasma for effecting the etching is used.

According to the first embodiment of the present invention constructed as mentioned above, since the microwave 1 can be propagated over a long distance in the ECR region 3 distributed in opposition to a surface of the specimen 7 and parallel to that surface, the efficiency of absorption of the microwave in the ECR region can be improved.

Figure 5:
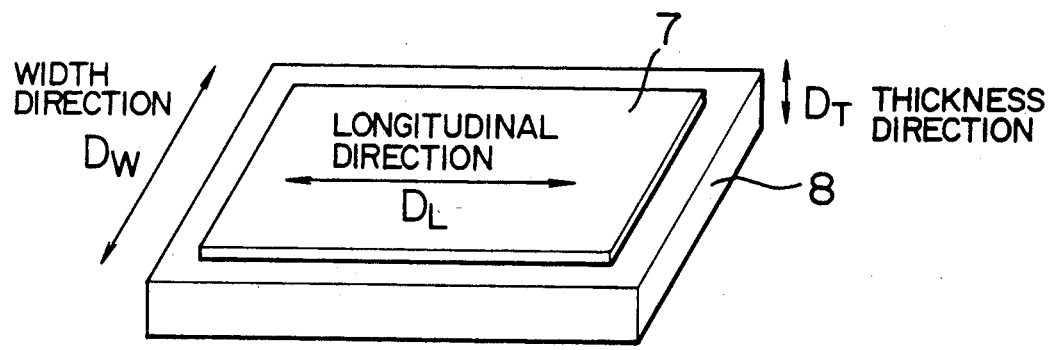
FIG. 5 is a perspective view showing a specimen and a specimen table used in the present invention.

FIG. 5 shows a perspective view of the specimen 7 and a specimen table 8 having the specimen 7 held thereon. The width direction $D_W$, longitudinal direction $D_L$ and thickness direction $D_T$ of the specimen 7 and specimen table 8 are defined as shown in FIG. 5.

Figure 6:
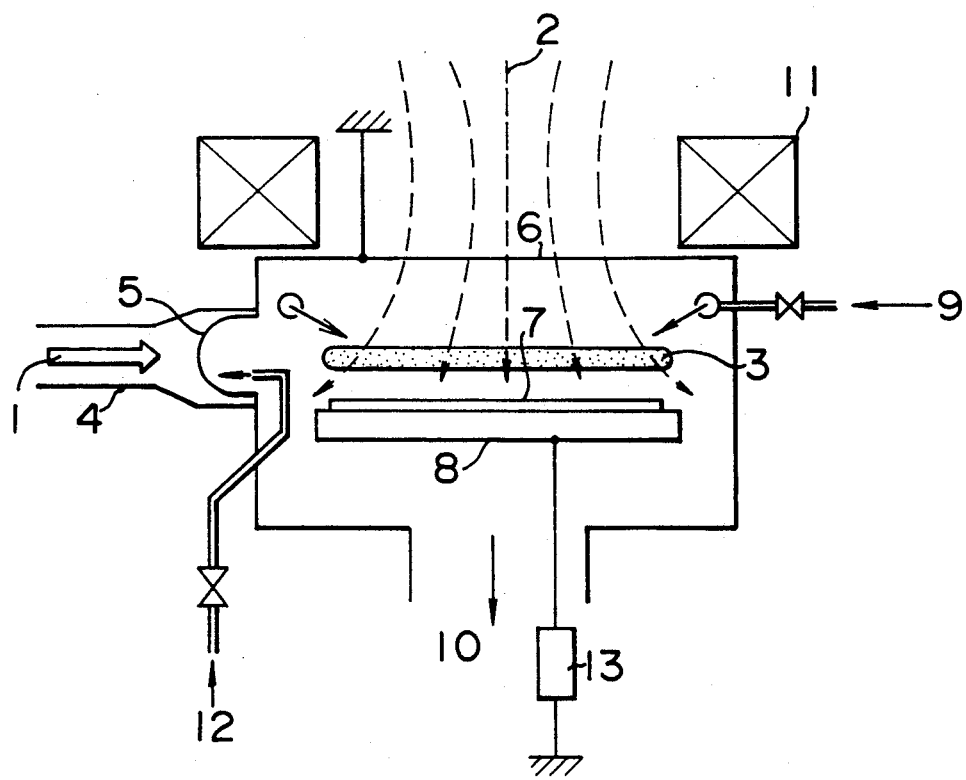
FIG. 6 is a cross section showing the construction of a plasma processing apparatus according to a second embodiment of the present invention.

FIG. 6 is a cross section showing the construction of a plasma processing apparatus according to a second embodiment of the present invention. In FIG. 6, reference numeral 13 designates an AC power source or DC power source. The remaining reference numerals used in FIG. 6 are the same as the reference numerals used in FIG. 2.

In the second embodiment of the present invention, an electric field is applied to a specimen table 8 by use of the AC power source or DC power source 13. Since a surface portion of a specimen chamber 6 above a specimen 7 can be made flat and it can be used as a grounded counter electrode, the electric field applied to the specimen 7 can be made uniform, thereby making it possible to subject the specimen to a uniform treatment.

Figure 7:
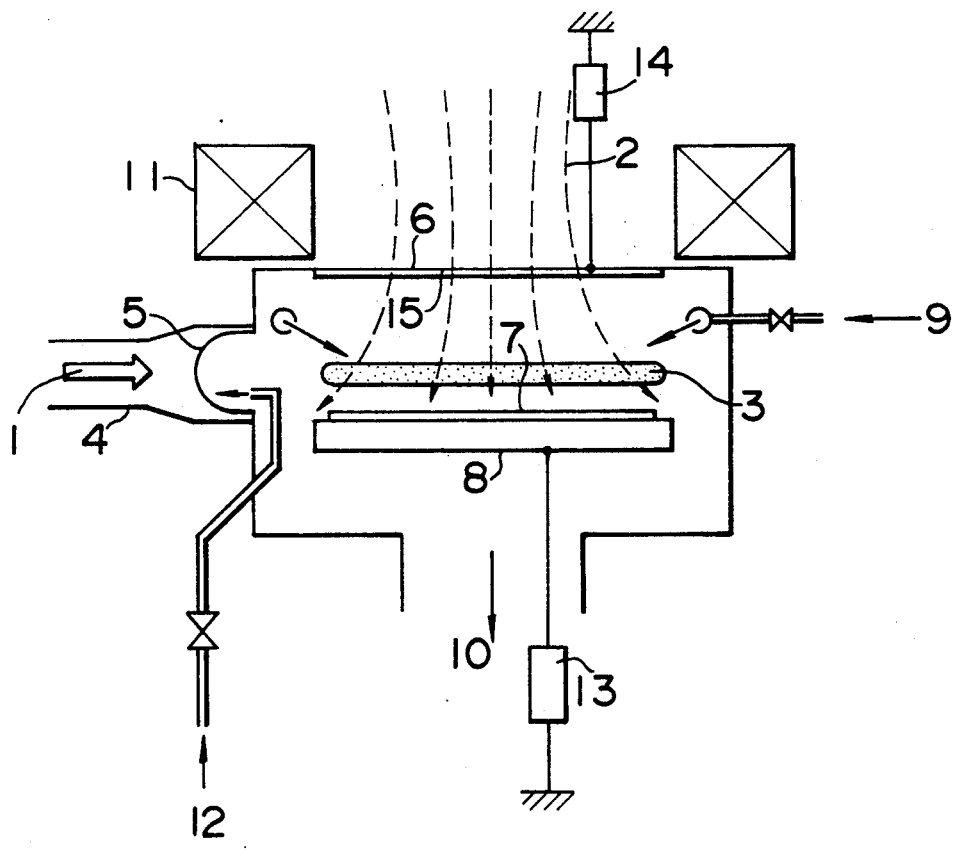
FIG. 7 is a cross section showing the construction of a plasma processing apparatus according to a third embodiment of the present invention.

FIG. 7 is a cross section showing the construction of a plasma processing apparatus according a third embodiment of the present invention. In FIG. 7, reference numeral 14 designates an AC power source or DC power source and numeral 15 designates a counter electrode. The remaining reference numerals used in FIG. 7 are the same as the reference numerals used in FIG. 6.

In the third embodiment of the present invention, the counter electrode 15 is provided above a specimen 7 in order to effectively develop an electric field from an AC power source or DC power source and the AC power source or DC power source is connected to the counter electrode 15. The third embodiment has an effect equivalent to the effect obtained by the second embodiment.

Figure 8:
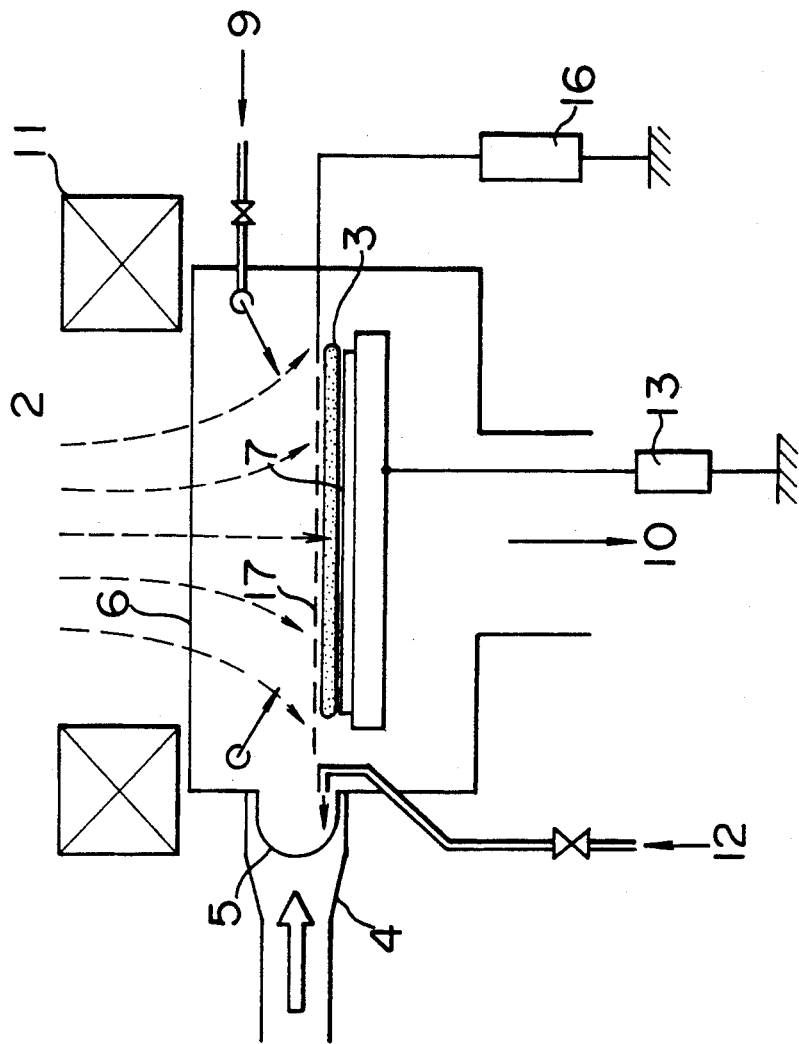
FIG. 8 is a cross section showing the construction of a plasma processing apparatus according to a fourth embodiment of the present invention.

FIG. 8 is a cross section showing the construction of a plasma processing apparatus according to a fourth embodiment of the present invention. In FIG. 8, reference numeral 16 designates an AC power source or DC power source and numeral 17 designates a counter electrode. The remaining reference numerals used in FIG. 8 are the same as the reference numerals used in FIG. 7.

In the fourth embodiment of the present invention, the counter electrode 17 is provided above and in the vicinity of a specimen 7. The counter electrode 17 is a mesh-like or grid-like perforated electrode. The AC power source or DC power source 16 is connected to the counter electrode 17. With such a construction, there is provided an effect that it is possible to have a strong electric field act on the specimen 7.

Figure 9:
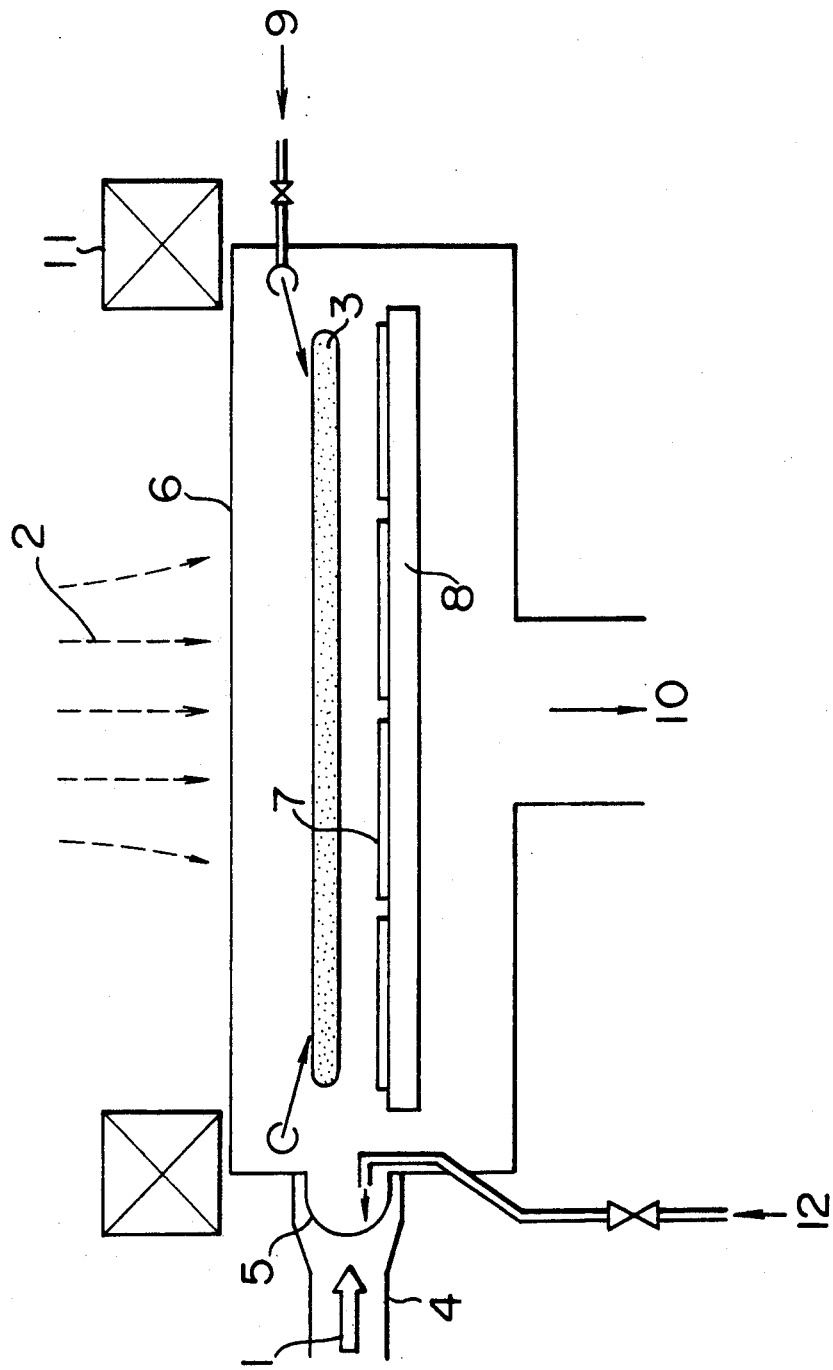
FIG. 9 is a cross section showing the construction of a plasma treatment apparatus according to a fifth embodiment of the present invention.

FIG. 9 is a cross section showing the construction of a plasma processing apparatus according to a fifth embodiment of the present invention. Reference numerals used in FIG. 9 are the same as those used in FIG. 4.

The fifth embodiment of the present invention is constructed such that a plurality of specimens 7 can be placed on a specimen table 8, thereby making it possible to improve the efficiency of treatment of the specimens 7.

Figure 10:
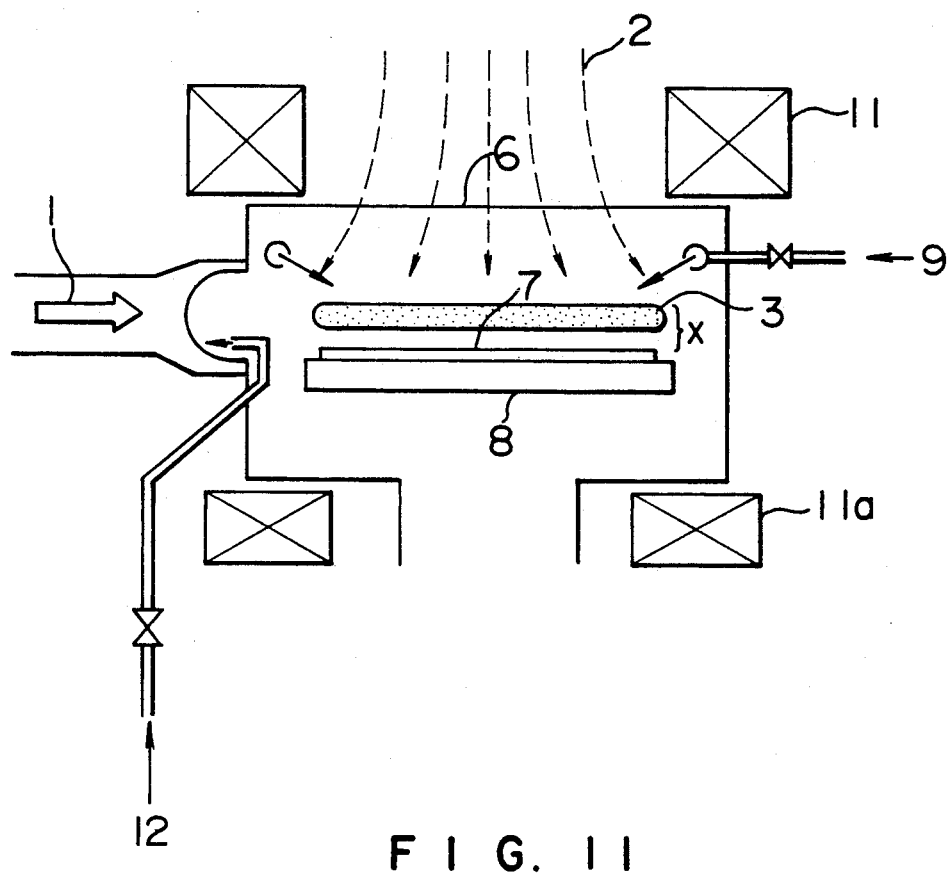
FIG. 10 is a cross section showing the construction of a plasma processing apparatus according to a sixth embodiment of the present invention.

FIG. 10 is a cross section showing the construction of a plasma processing apparatus according to a sixth embodiment of the present invention. In FIG. 10, reference numeral 11a designates magnetic field generating means. The remaining reference numerals used in FIG. 10 are the same as the reference numerals used in FIG. 4.

In the sixth embodiment of the present invention, the magnetic field generating means 11a is additionally provided below a specimen 7. By controlling two magnetic field generating means 11 and 11a, it is possible to control the profile of the distribution of a magnetic line of force developed and a distance x between an ECR region 3 and a specimen 7, thereby providing an excellent controllability of magnetic line of force.

Figure 11:
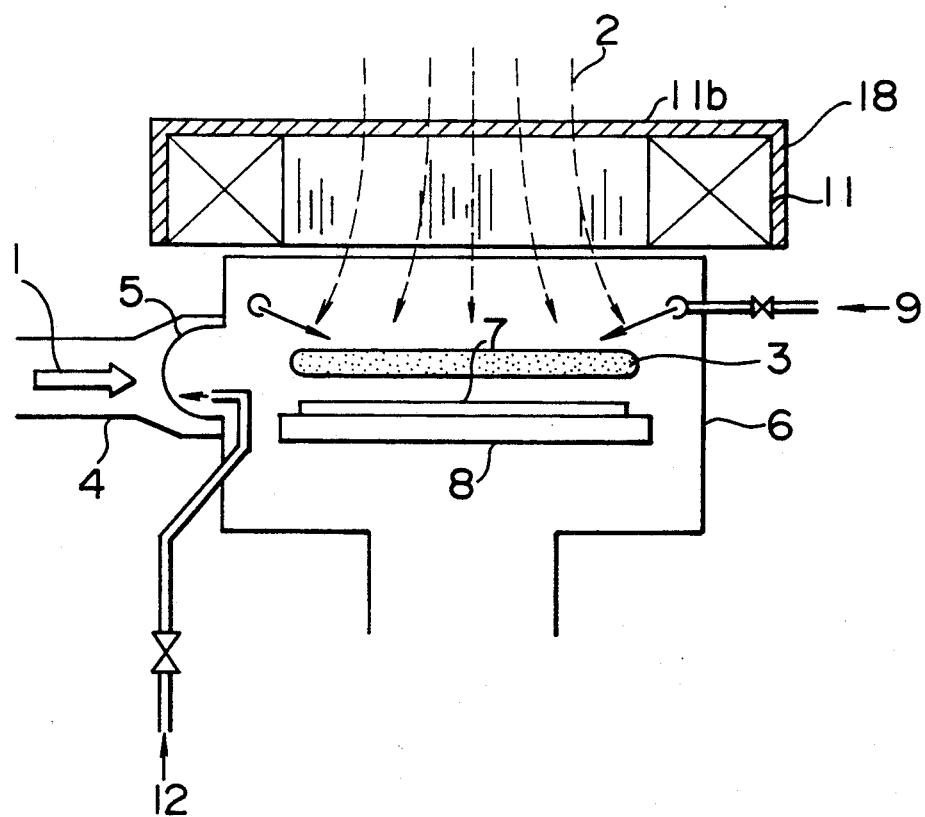
FIG. 11 is a cross section showing the construction of a plasma processing apparatus according to a seventh embodiment of the present invention.

FIG. 11 is a cross section showing the construction of a plasma processing apparatus according to a seventh embodiment of the present invention. In FIG. 11, reference numeral 11b designates a magnetic core and numeral 18 designates a cover made of magnetic materials respectively. The remaining reference numerals used in FIG. 11 are the same as the reference numerals used in FIG. 4.

Figure 2:
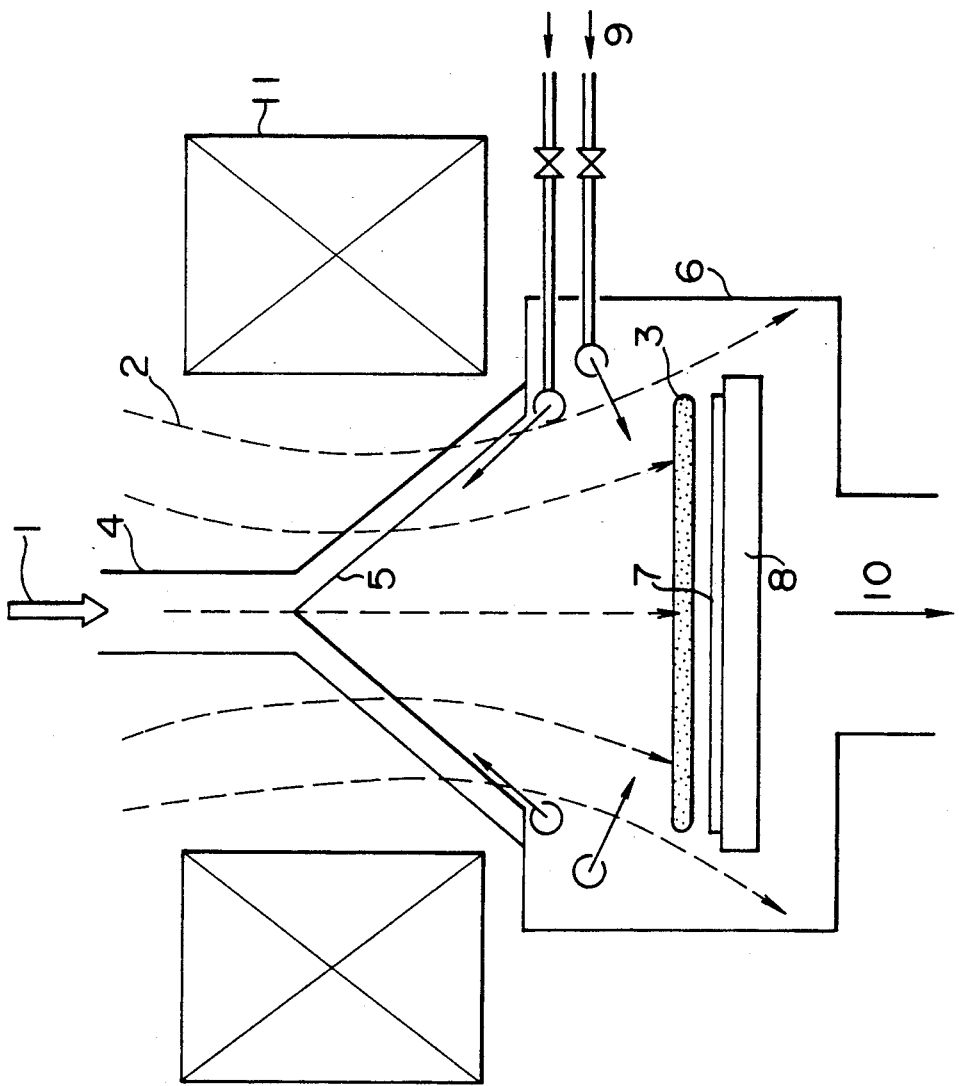
FIG. 2 is a cross section showing the construction of the conventional plasma processing apparatus.

In the seventh embodiment of the present invention, magnetic field generating means 11 is provided with the magnetic core 11b, thereby making the size of the magnetic field generating means 11 small. In the conventional apparatus, since it is necessary to have the waveguide 4 for microwave extend through a central portion of the magnetic field generating means 11, as shown in FIG. 2, it is impossible to use a magnetic field generating device having a magnetic core. On the other hand, in the present invention, it is possible to use magnetic field generating means having a magnetic core.

The foregoing embodiments have been explained in conjunction with a construction in which one specimen table 8 is used and a specimen(s) 7 on one surface of the specimen table 8 is subjected to a plasma treatment. However, as shown in embodiments which will be explained below, the present invention can be embodied with a construction in which a specimen is placed on each of opposite surfaces of a specimen table 8 disposed in a central portion of a specimen chamber so that the specimens on the opposite surfaces of the specimen table are subjected to a plasma treatment simultaneously or one at a time, a construction in which specimen tables are disposed on opposite wall sides of a specimen chamber and specimens are placed on surfaces of the specimen tables opposing to each other and facing plasma so that the specimens on the opposing surfaces of the specimen tables are subjected to a plasma treatment at a time, or a construction based on the combination of the above-mentioned two constructions.

Figure 12:
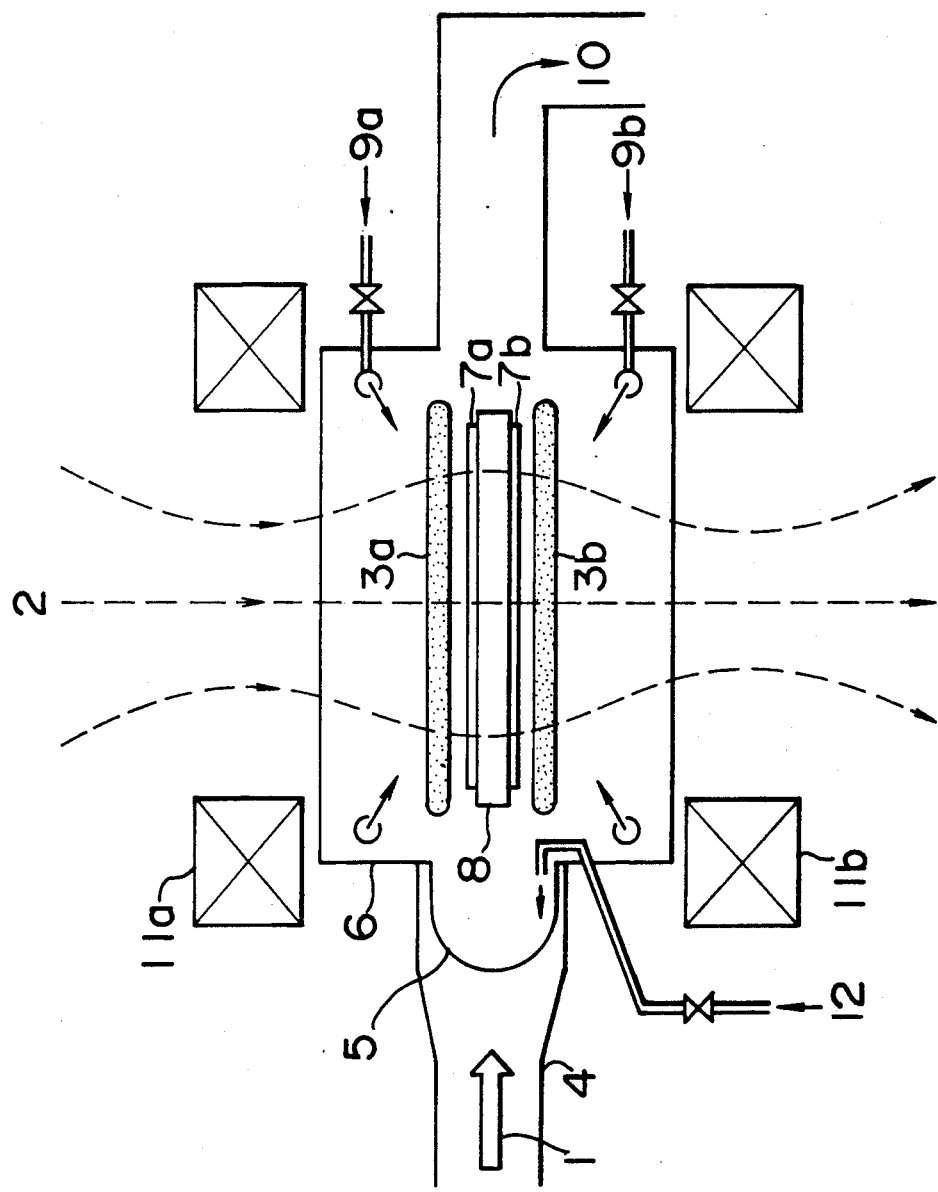
FIG. 12 is a cross section showing the construction of a plasma processing apparatus according to an eighth embodiment of the present invention.

FIG. 12 is a cross section showing the construction of a plasma processing apparatus according to an eighth embodiment of the present invention. A microwave 1 is introduced into a specimen chamber 6 through a waveguide 4 and a microwave introducing window 5 from a direction orthogonal to a magnetic line of force 2. A specimen table 8 is disposed in a substantially central portion of the specimen chamber 6. Specimens 7a and 7b are respectively placed on opposite surfaces of the specimen table 8. After a first reactive gas 12 and second reactive gases 9a and 9b are introduced and the specimen chamber 6 is exhausted by means of a vacuum exhaust device 10 to adjust the inner pressure of the specimen chamber 6 to a predetermined value, a magnetic line of force is generated by magnetic field generating means 11a and 11b so that active plasma regions or ECR regions 3a and 3b are produced above the specimen 7a and below the specimen 7b, respectively, thereby allowing simultaneous treatment of the specimens 7a and 7b.

Since a Miller magnetic line of force is produced by use of the magnetic field generating means 11a and 11b, the strength of the magnetic line of force is strong at the wall side of the specimen chamber 6 close to the coil and weak in the vicinity of the central portion of the specimen chamber 6 at which the specimens 7a and 7b are placed. Therefore, charged particles (ions and electrons) in the plasma are liable to undergo a force toward the vicinity of the central portion of the specimen chamber 6 so that they are collected thereat. As a result, the plasma treatment of the specimens 7a and 7b are made under the action of both the charged particles and the neutral radicals.

According to the eighth embodiment of the present invention, there is provided an effect that the specimens 7a and 7b on the opposite surfaces the specimen table 8 can be treated at a time, thereby improving the productivity of plasma treatment.

Figure 13:
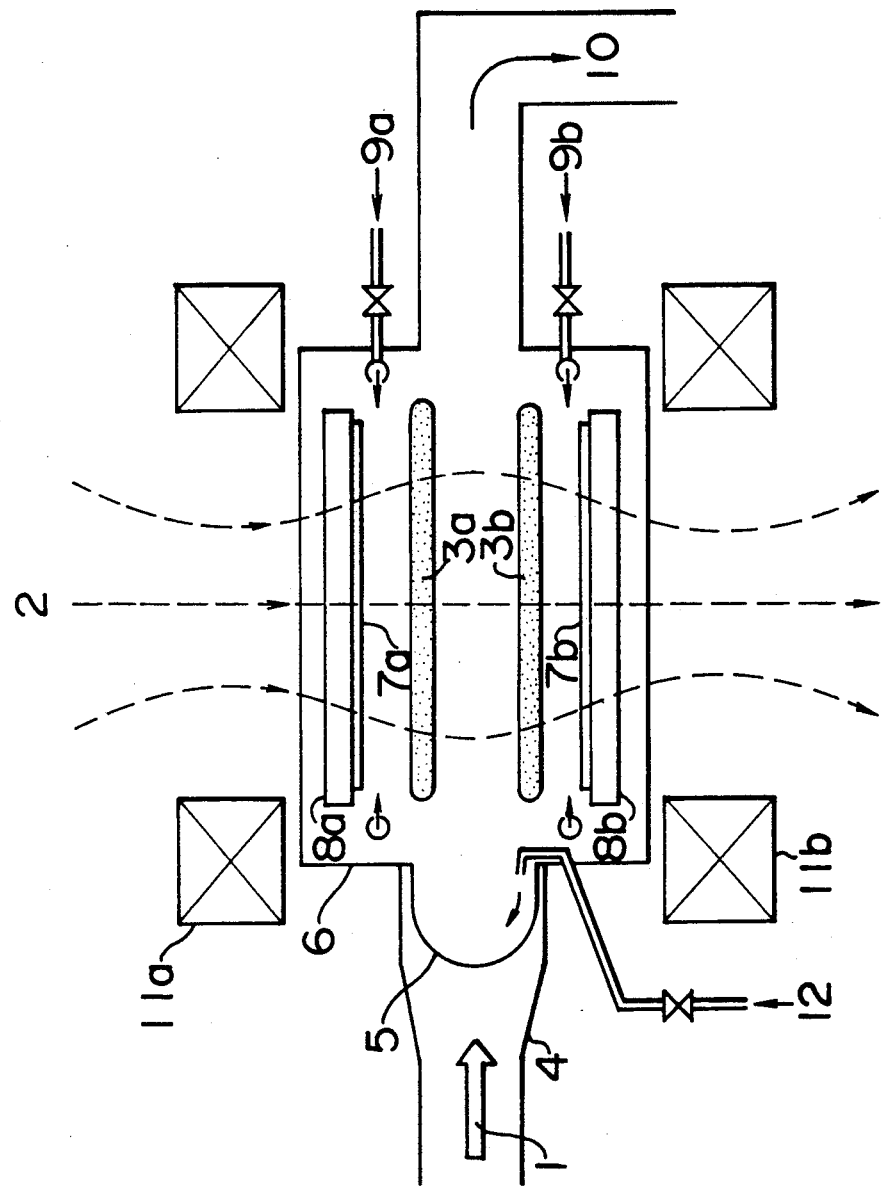
FIG. 13 is a cross section showing the construction of a plasma processing apparatus according to a ninth embodiment of the present invention.

FIG. 13 shows a ninth embodiment of the present invention in which specimen tables 8a and 8b are respectively disposed on opposite wall sides of a specimen chamber 6. A magnetic line of force 2 having a Miller magnetic line of force configuration is generated by use of magnetic field generating means 11a and 11b so that ECR regions 3a and 3b are produced. Thereby, it is possible to simultaneously treat specimens 7a and 7b which are placed on the specimen tables 8a and 8b, respectively. In the present embodiment, since the strength of the magnetic line of force is strong at the specimens 7a and 7b and weak at the central portion of plasma, ions and electrons are liable to be collected at central portion of the plasma and hard to go to the specimens 7a and 7b. Accordingly, the present embodiment is preferable for plasma treatment of specimens by neutral radicals.

Figure 14:
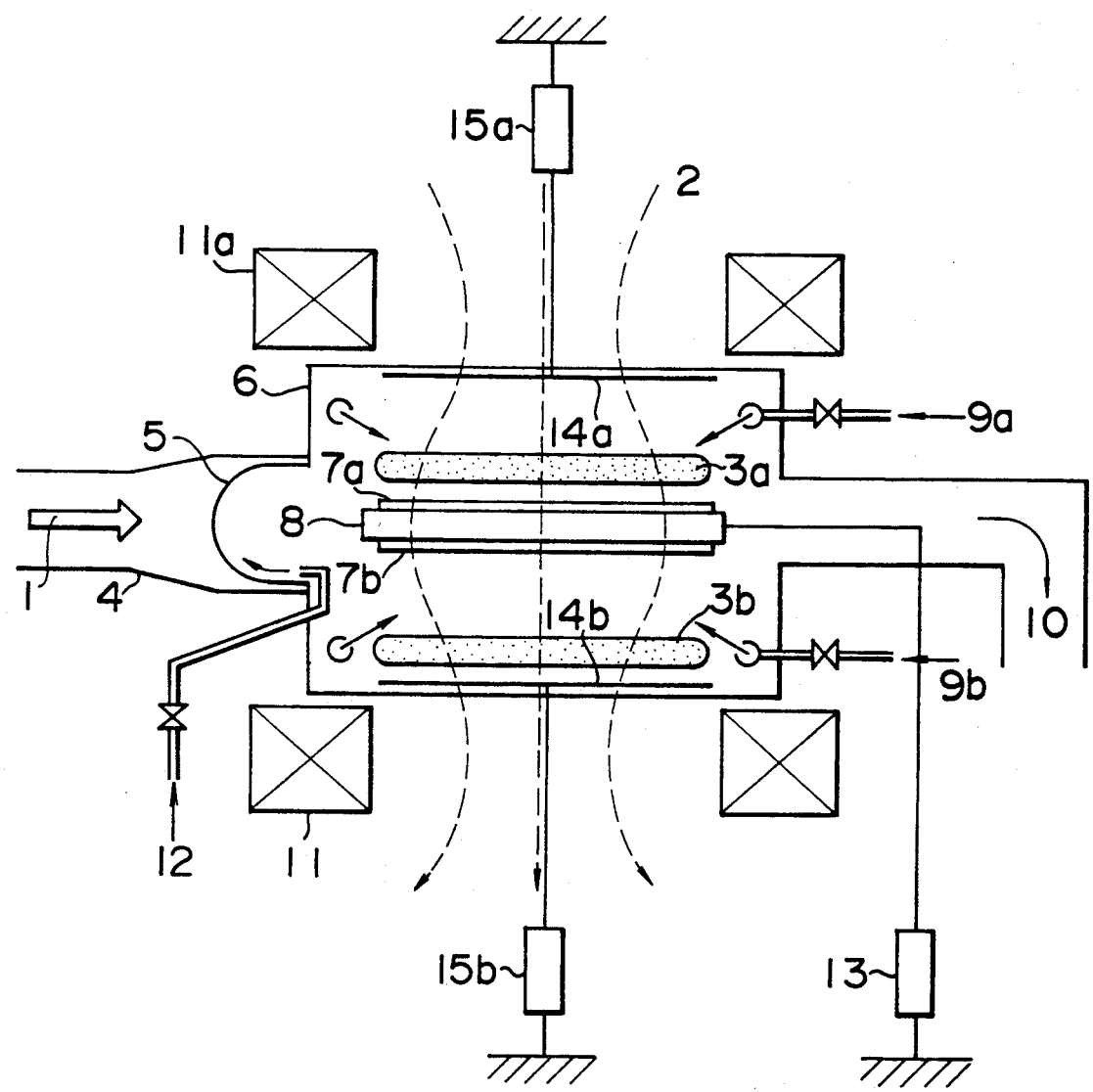
FIG. 14 is a cross section showing the construction of a plasma processing apparatus according to a tenth embodiment of the present invention.

FIG. 14 shows a tenth embodiment of the present invention in which a counter electrode 14a is provided above a specimen 7a placed on the upper surface of a specimen table 8 disposed in the central portion of a specimen chamber 6 while a counter electrode 14b is provided below a specimen 7b placed on the lower surface of the specimen table 8. According to the present embodiment, it is possible to have a uniform electric field act on the specimens 7a and 7b to control plasma generated. A power source 13 connected to the specimen table 8, a power source 15a connected to the counter electrode 14a and a power source 15b connected to the counter electrode 14b may be of AC type, DC type or the combination thereof, depending on a control to be made.

Figure 15:
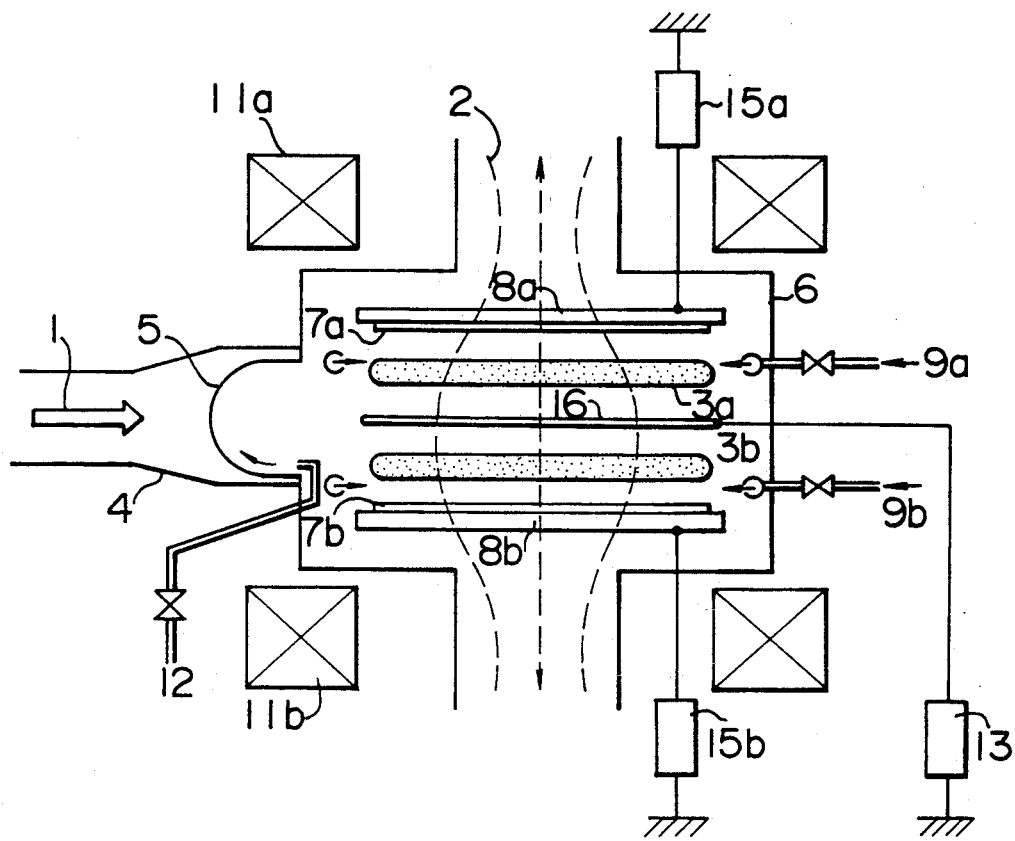
FIG. 15 is a cross section showing the construction of a plasma processing apparatus according to an eleventh embodiment of the present invention.

FIG. 15 shows an eleventh embodiment of the present invention in which an electrode 16 connected to a power source 13 is provided at the central portion of a specimen chamber 6 to apply a voltage between specimen tables 8a and 8b disposed on opposite wall sides of the specimen chamber 6 by means of power sources 15a and 15b. According to the present embodiment, there is provided an effect that it is possible to have a uniform electric field act on the specimens 7a and 7b so that plasma generated is controlled.

Figure 16:
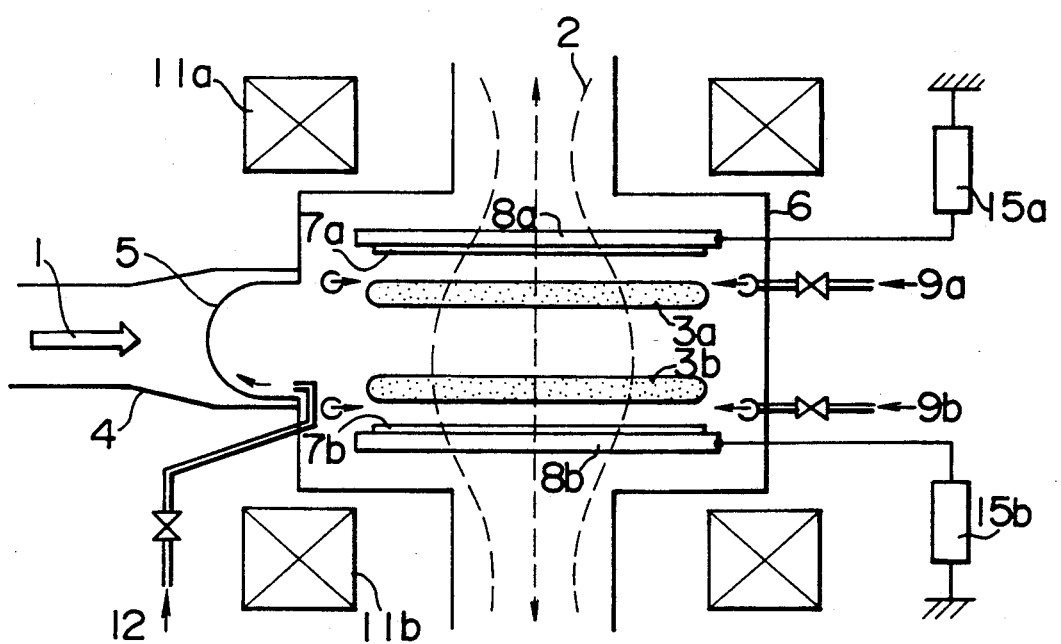
FIG. 16 is a cross section showing the construction of a plasma processing apparatus according to a twelfth embodiment of the present invention.

FIG. 16 shows a twelfth embodiment of the present invention in which the electrode 6 provided at the central portion of the specimen chamber 16 in the eleventh embodiment shown in FIG. 15 is omitted. In the present embodiment, a voltage is applied using specimen tables 8a and 8b as counter electrodes. If power sources 15a and 15b are of AC type and the AC voltages are applied with phases shifted by 180°, ions in plasma can be alternately attracted by specimens 7a and 7b placed on the specimen tables 8a and 8b.

Figure 17:
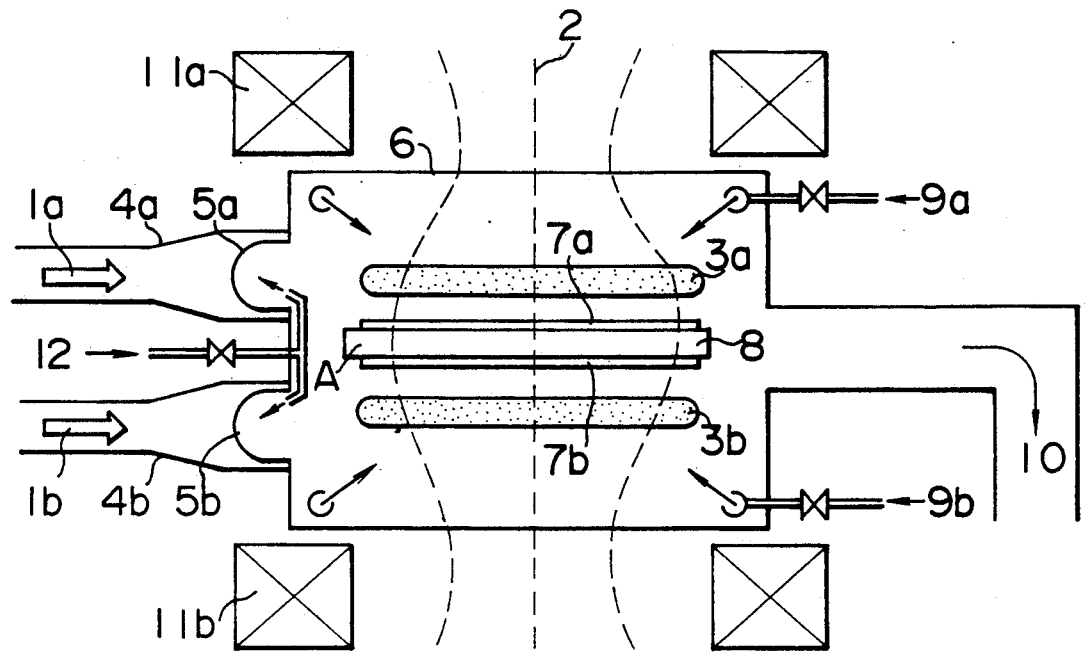
FIG. 17 is a cross section showing the construction of a plasma processing apparatus according to a thirteenth embodiment of the present invention.

FIG. 17 shows a thirteenth embodiment of the present invention in which microwaves 1a and 1b are introduced into a specimen chamber 6 through waveguides 4a and 4b and microwave introducing windows 5a and 5b from positions substantially symmetrical with respect to a specimen table 8 or the planes of specimens 7a and 7b. According to the present embodiment, since it is possible to displace the microwave introducing position so that the microwave does not impinge upon a side end portion A of the specimen table 8, there is provided an effect that the reflection of the microwave at the side end portion A of the specimen table 8 can be prevented, thereby enhancing the efficiency of incidence of microwave.

Figure 18:
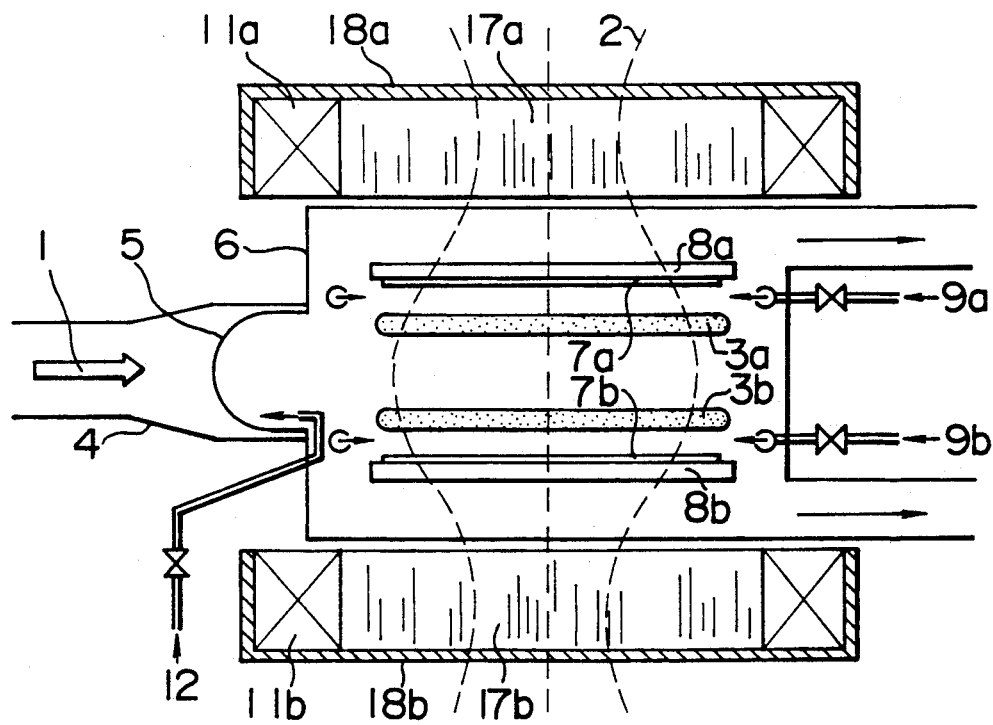
FIG. 18 is a cross section showing the construction of a plasma processing apparatus according to a fourteenth embodiment of the present invention.

FIG. 18 shows a fourth embodiment of the present invention in which magnetic field generating means 11a and 11b are provided with magnetic cores 17a and 17b and covers 18a and 18b made of magnetic materials respectively. According to the present embodiment, there is provided an effect that the size of each of the magnetic field generating means 11a and 11b can be made small.

The magnetic field generating means 11a (or 11b) may be provided with both of the magnetic core 17a (or 17b) and the magnetic material cover 18a (or 18b) in combination as shown or either one of the magnetic core 17a (or 17b) and the magnetic material cover 18a (or 18b). The magnetic core and/or the magnetic material cover can be used also in the embodiment of FIG. 12 and embodiments (for example, of FIG. 19) which will be explained hereinafter.

Figure 19:
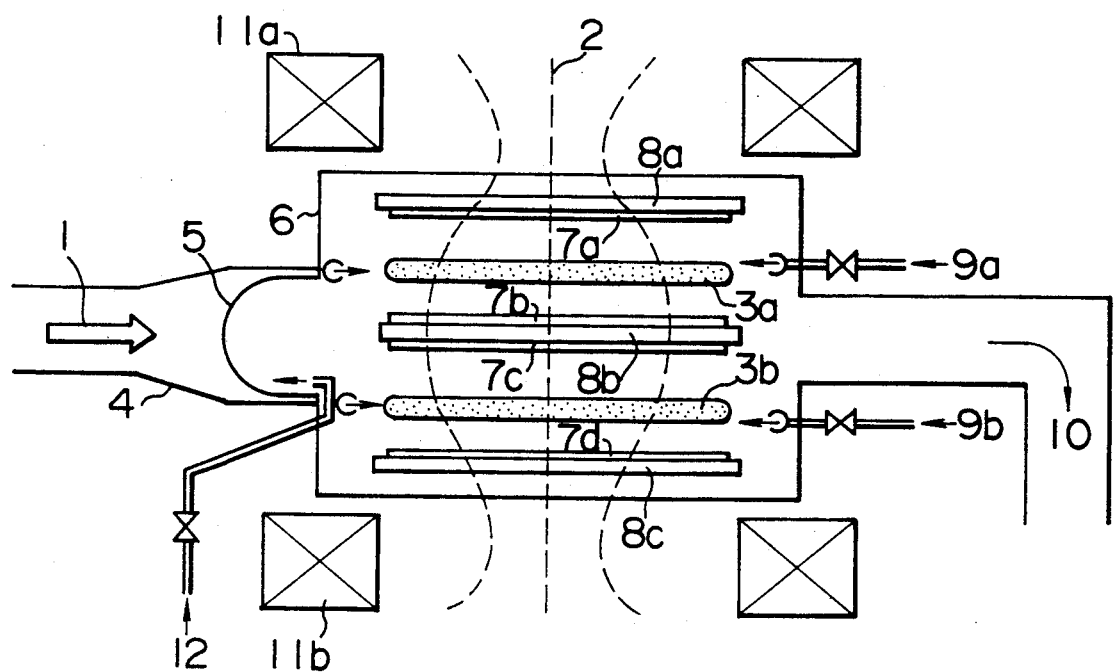
FIG. 19 is a cross section showing the construction of a plasma processing apparatus according to a fifteenth embodiment of the present invention.

FIG. 19 shows a fifth embodiment of the present invention in which specimens 7b and 7c are placed on upper and lower surfaces of a specimen table 8b disposed in the central portion of a specimen chamber 6 and specimens 7a and 7d are placed on specimen tables 8a and 8c disposed on opposite wall sides of the specimen chamber 6, thereby further improving the productivity of plasma treatment.

Figure 20:
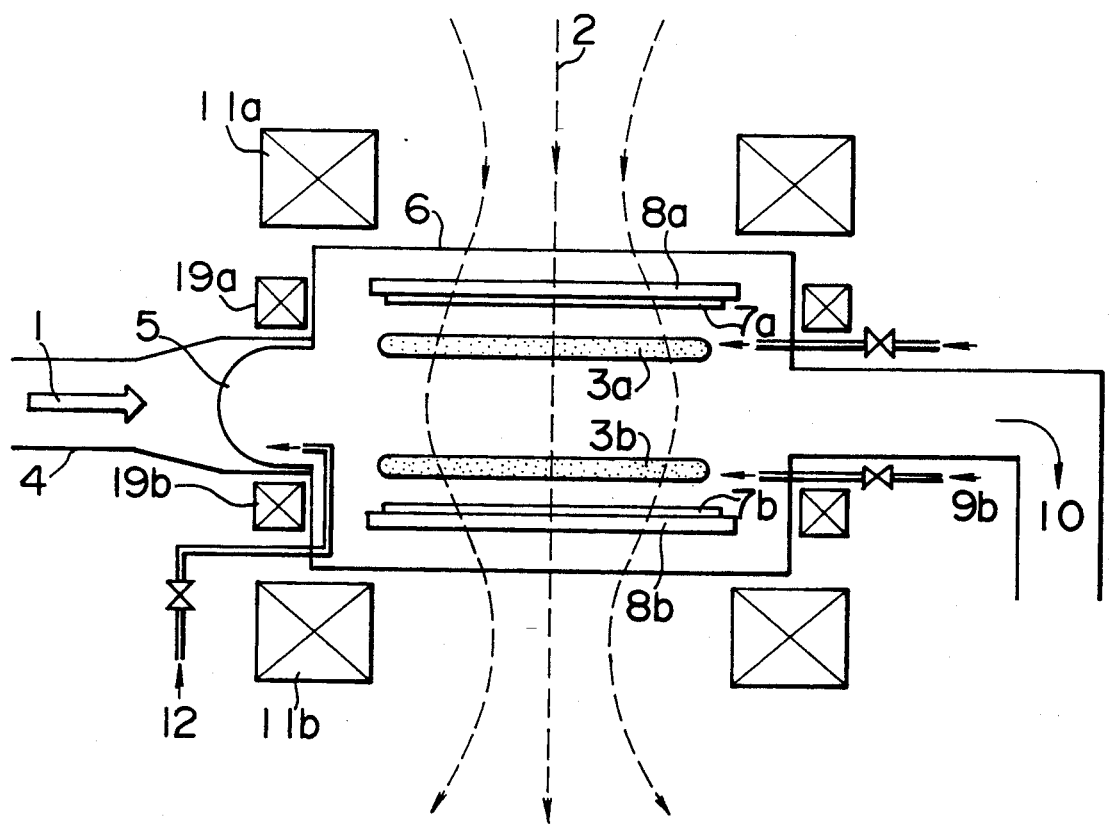
FIG. 20 is a cross section showing the construction of a plasma processing apparatus according to a sixteenth embodiment of the present invention.

FIG. 20 shows a sixth embodiment of the present invention in which auxiliary magnetic field generating means 19a and 19b are provided in addition to magnetic field generating means 11a and 11b, thereby making it possible to finely control the magnitude and/or distribution of magnetic field so that the shape of plasma, an ECR region, position or the like can be controlled. The auxiliary magnetic field generating means 19a and 19b may be provided also in the other embodiment including the embodiments shown in FIGS. 12 and 19. Also, the auxiliary field generating means 19a and 19b may be placed in the specimen chamber 6, as required.

Figure 21:
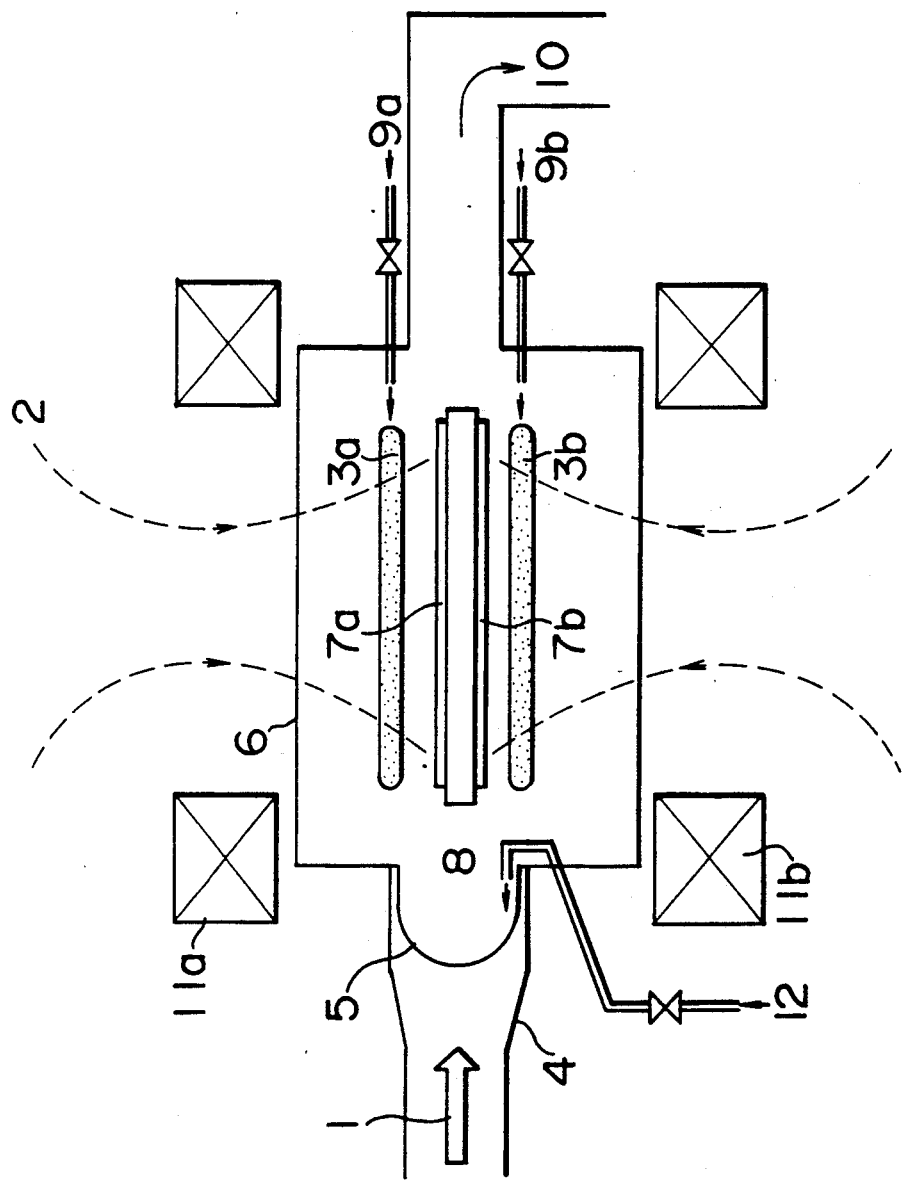
FIG. 21 is a cross section showing the construction of a plasma processing apparatus according to a seventeenth embodiment of the present invention.

FIG. 21 shows a seventh embodiment of the present invention in which magnetic field generating means 11a and 1b are constructed so as to produce a magnetic line of force having a cusp magnetic line of force configuration. Since the most of charged particles run away in the direction of the planes of specimens 7a and 7b along the lines of magnetic force, the present embodiment is preferable for plasma treatment of the specimens 7a and 7b by radicals.

If a proper amount of magnetic materials are used for a specimen table 8, some of the lines of magnetic force can pass through the specimen table 8 even in the case of the cusp magnetic line of force configuration so that plasma treatment by changed particles in addition to the radicals can be made.

Even in the case of the Miller magnetic line of force configuration, when a proper amount of magnetic materials are used for the specimen table 8, the strength of the magnetic line of force at the surfaces of the specimens 7a and 7b can be enhanced to correspondingly increase the amount of charged particles and hence to improve the effect of plasma treatment.

The magnetic field generating means 11a or 11b can be constructed by use of a permanent magnet in place of a coil.

Figure 22:
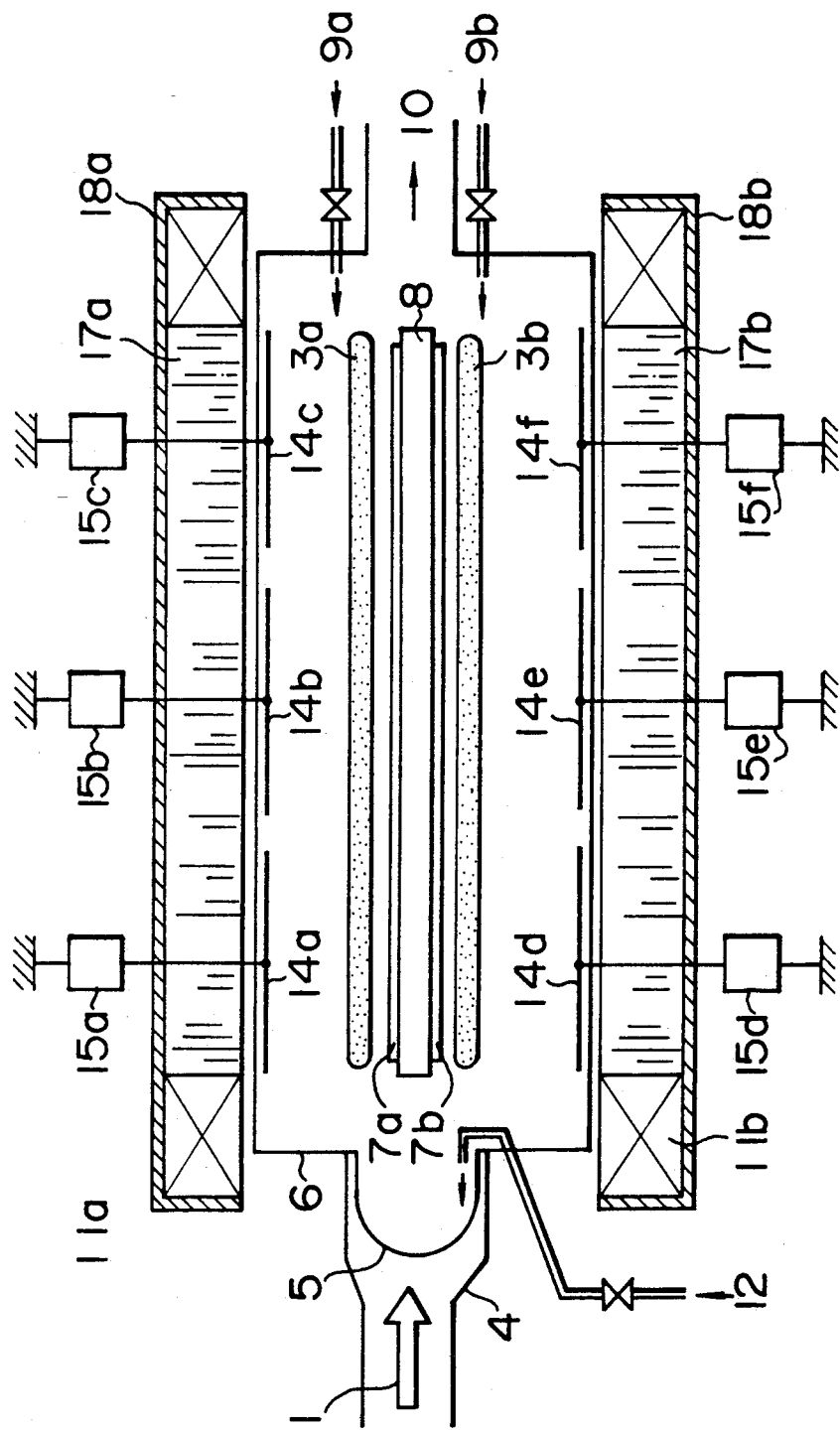
FIG. 22 is a cross section showing the construction of a plasma processing apparatus according to an eighteenth embodiment of the present invention.

FIG. 22 shows an eighteenth embodiment of the present invention in which a plurality of segmental counter electrodes 14a to 14f are provided on wall sides of a specimen chamber 6. Power sources 15a to 15f are connected to the segmental counter electrodes 14a to 14f respectively so that electric potentials applied can be arbitrarily changed. With such a construction, when each of specimens 7a and 7b has a large area, any unhomogeneity of the distribution of a magnetic field, a microwave, a gas or the like can be minimized by the adjustment of the electric potentials between the specimens 7a, 7b and the counter electrodes 14a to 14f to change the density and energy of charged particles so that the rate of plasma treatment is made uniform.

Each of the foregoing embodiments has been explained by way of example a thin film forming apparatus in which a first reactive gas and a second reactive gas are used as gases. However, it is of course that the kinds of gases may be arbitrarily selected in accordance with the other applications of the present invention to an etching apparatus, a sputtering apparatus, a plasma oxidation apparatus, etc.

As has been explained above, the present invention provides the following excellent effects.

(1) The energy of a microwave can be effectively absorbed and utilized and it is possible to have an AC or DC electric field uniformly act on the surface of a specimen. Thereby, it is possible to effectively and uniformly perform the treatment of the specimen.

(2) A specimen having a large area can be treated at a time and uniformly.

(3) Since a plurality of specimens can be plasma-treated at a time, it is possible to improve the productivity of plasma treatment.

(4) When a cusp magnetic line of force configuration is employed, it is possible to treat a specimen by radicals.

(5) If a counter electrode is provided parallel to the surface of a specimen, the efficiency of application of an electric field to the specimen can be improved.

(6) If a magnetic material is used for a specimen table, the density of charged particles at the surface of a specimen can be improved.

(7) If a plurality of microwave introducing means are used, it is possible to reduce the reflection of microwave from a portion of a specimen table upon which the microwave otherwise impinges.

(8) If a coil with magnetic core and a cover made of a magnetic material are used, it is possible to reduce the resistance of a magnetic circuit and to make the size of a coil for a magnetic field generating means small.

(9) Especially, in the case of a specimen having a large area, if a counter electrode is divided into a plurality of segmental parts, it is possible to minimize any inhomogeneity of the distribution of a magnetic line of force, a microwave or the like by virtue of an electric field, thereby making the rate of plasma treatment uniform

We claim:

1. A microwave-excited plasma processing apparatus comprising:
   a specimen chamber provided with a specimen table for holding a specimen thereon;
   microwave introducing means for introducing a microwave into said specimen chamber;
   reactive gas introducing means for introducing a reactive gas into said specimen chamber;
   a vacuum exhaust system for vacuum-exhausting said specimen chamber; and
   magnetic field generating means providing a divergent magnetic field having lines of force substantially perpendicular to said specimen table for generating an equivalent flux density surface (ECR surface) for causing an electron cyclotron resonance (ECR), said specimen being processed by using plasma generated at said ECR surface, said divergent magnetic field becoming weaker in a direction from said plasma to said specimen table, wherein said microwave is introduced from a direction substantially orthogonal to said magnetic lines of force so as to propagate in a longitudinal direction of an electron cyclotron resonance region in said specimen chamber along the ECR surface of the electron cyclotron resonance region.

2. A microwave-excited plasma processing apparatus according to claim 1, wherein a counter electrode is provided above said specimen and parallel to said specimen, wherein said specimen table for holding said specimen and said counter electrode form two electrodes and at least one of a.c. voltage and d.c. voltage is supplied to at least one of said specimen table and said counter electrode to apply an electric field to said specimen.

3. A microwave-excited plasma processing apparatus according to claim 1, wherein in addition to said magnetic field generating means, auxiliary magnetic field generating means is provided for controlling the distribution of said magnetic lines of force.

4. A microwave-excited plasma processing apparatus according to claim 1, wherein at least one stage of said microwave introducing means is provided in a direction of width of said specimen table.

5. A microwave-excited plasma processing apparatus comprising:
   a specimen chamber provided with a specimen table for holding a specimen thereon;
   microwave introducing means for introducing a microwave into said specimen chamber;
   reactive gas introducing means for introducing a reactive gas into said specimen chamber;
   a vacuum exhaust system for vacuum-exhausting said specimen chamber; and
   magnetic field generating means providing a divergent magnetic field having lines of force substantially perpendicular to said specimen table for generating an equivalent flux density surface (ECR surface) for causing an electron cyclotron resonance (ECR), said specimen being processed by using plasma generated at said ECR surface, said divergent magnetic field becoming weaker in a direction from said plasma to said specimen table, wherein said microwave is introduced from a direction substantially orthogonal to said magnetic lines of force in said specimen chamber.

6. A microwave-excited processing apparatus according to claim 5, wherein a counter electrode is provided above said specimen and parallel to said specimen and a power source is connected to said counter electrode to apply an electric field to said specimen.

7. A microwave-excited plasma processing apparatus according to claim 5, wherein in addition to said magnetic field generating means, auxiliary magnetic field generating mans is provided for controlling the distribution of said magnetic lines of force.

8. A microwave-excited processing apparatus according to claim 5, wherein at least one stage of said microwave introducing means is provided in a direction of width of said specimen table.

9. A microwave-excited plasma processing apparatus comprising:
   a specimen chamber provided with a specimen table for holding a specimen thereon;
   microwave introducing means for introducing a reactive gas into said specimen chamber;
   reactive gas introducing means for introducing a reactive gas in to said specimen chamber;
   a vacuum exhaust system for vacuum-exhausting said specimen chamber; and
   magnetic field generating means providing a magnetic line of force substantially perpendicular to said specimen tale for generating an equivalent flux density surface (ECR surfaces) for causing an electron cycletron resonance (ECR), said specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region;
   wherein a counter electrode is provided above said specimen and parallel to said specimen, wherein said specimen table for holding said specimen and said counter electrode form two electrodes and at least one of a.c. voltage and d.c. voltage is supplied to at least one of said specimen table and said counter electrode to apply an electric field to said specimen; and
   wherein said counter electrode includes a wall portion of said specimen chamber above said specimen.

10. A microwave-excited plasma processing apparatus comprising:
    a specimen chamber provided with a specimen table for holding a specimen thereon;
    microwave introducing means for introducing a microwave into said specimen chamber;
    reactive gas introducing means for introducing a reactive gas into said specimen chamber;
    a vacuum exhaust system for vacuum-exhausting said specimen chamber; and
    magnetic field generating means providing a magnetic line of force substantially perpendicular to said specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber;
    wherein a counter electrode is provided above said specimen and parallel to said specimen and a power source is connected to said counter electrode to apply an electric field to said specimen; and
    wherein said counter electrode includes a wall portion of said specimen chamber above said specimen.

11. A microwave-excited plasma processing apparatus comprising:
    a specimen chamber provided with a specimen table for holding a specimen thereon;
    microwave introducing means for introducing a microwave into said specimen chamber;
    reactive gas introducing means for introducing a reactive gas into said specimen chamber;
    a vacuum exhaust system for vacuum-exhausting said specimen chamber; and
    magnetic field generating means providing a magnetic line of force substantially perpendicular to said specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region;
    wherein said magnetic field generating means is provided with a magnetic core.

12. A microwave-excited plasma processing apparatus comprising:
    a specimen chamber providing with a specimen table for holding a specimen thereon;
    microwave introducing means for introducing a microwave into said specimen chamber;
    reactive gas introducing means for introducing a reactive gas into said specimen chamber;
    a vacuum exhaust system for vacuum-exhausting said specimen chamber; and
    magnetic field generating means providing a magnetic line of force substantially perpendicular to said specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber;
    wherein said magnetic field generating means is provided with a magnetic core.

13. A micro-wave excited plasma processing apparatus comprising:
    a specimen chamber provided with a specimen table for holding a specimen thereon;
    microwave introducing means for introducing a microwave into said specimen chamber;
    reactive gas introducing means for introducing a reactive gas into said specimen chamber;

a vacuum exhaust system for vacuum-exhausting said specimen chamber; and magnetic field generating means providing a magnetic line of force substantially perpendicular to said specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region;

wherein said magnetic field generating means is provided with a cover made of a magnetic material.

14. A microwave-excited plasma processing apparatus comprising:

a specimen chamber provided with a specimen table for holding a specimen thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber;

wherein said magnetic field generating means is provided with a cover made of a magnetic material.

15. A microwave-excited plasma processing apparatus comprising:

a specimen chamber provided with at least one specimen table for holding at least one specimen thereon;

microwave introducing means of introducing a microwave into said specimen chamber;

reactive gas introducing means for introducing a reactive gas into said specimen chamber;

a vacuum exhaust system for vacuum-exhausting said specimen chamber; and magnetic field generating means providing a divergent magnetic field having lines of force substantially perpendicular to said at least one specimen table for generating an equivalent flux density surface (ECR surface) for causing an electron cyclotron resonance (ECR), said divergent magnetic field becoming weaker in a direction from said plasma to said at least one specimen table, said at least one specimen being processed by using plasma generated at said ECR surface, wherein said microwave is introduced from a direction substantially orthogonal to said magnetic lines of force so as to propagate in a longitudinal direction of an electron cyclotron resonance region in said specimen chamber along the ECR surface of the electron cyclotron resonance region, and plasma treatment of said at least one specimen is carried out in said specimen chamber with respect to a plurality of surfaces of said at least one specimen table.

16. A microwave-excited plasma processing apparatus according to claim 15, wherein when an AC or DC electric field is applied to said at least one specimen table or said at least one specimen, counter electrodes are respectively provided facing and parallel to the surfaces of said at least one specimen.

17. A microwave-excited processing apparatus according to claim 15, wherein in addition to said magnetic field generating means, auxiliary magnetic field generating means is provided.

18. A microwave-excited plasma processing apparatus comprising:

a specimen chamber provided with at least one specimen table for holding a plurality of specimens thereon;

microwave introducing means for introducing a microwave into said specimen chamber;

reactive gas introducing means for introducing a reactive gas into specimen chamber;

a vacuum exhaust system for vacuum-exhausting said specimen chamber; and magnetic field generating means providing a divergent magnetic field having lines of force substantially perpendicular to said at least one specimen table for generating an equivalent flux density surface (ECR surface) for causing an electron cyclotron resonance (ECR), said specimen being processed by using plasma generated at said ECR surface, said divergent magnetic field becoming weaker in a direction from said plasma to said at least one specimen table, wherein said microwave is introduced from a direction substantially orthogonal to said magnetic lines of force in said specimen chamber and a place treatment of each of said plurality of specimens is carried out in said specimen chamber one at a time with respect to a plurality of surfaces of said at least one specimen table.

19. A microwave-excited plasma processing apparatus according to claim 18, wherein when an AC or DC electric field is applied to said at least one specimen table or said plurality of specimens, counter electrodes are respectively provided facing and parallel to the surfaces of said plurality of specimens.

20. A microwave-excited processing apparatus according to claim 18, wherein in addition to said magnetic field generating means, auxiliary magnetic field generating means is provided.

21. A microwave-excited plasma processing apparatus comprising:

a specimen chamber provided with at least one specimen table for holding at least one specimen thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said at least one specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region, and plasma treatment of said at lest one specimen is carried out in said specimen chamber with respect to a plurality of surfaces of said at least one specimen table;

wherein one specimen table is disposed in a central portion of said specimen chamber and said specimens are held on opposite surfaces of said specimen table.

22. A microwave-excited plasma processing apparatus comprising:

a specimen chamber provided with at lest one specimen table or holding a plurality of specimens thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber and plasma treatment of each of said plurality of specimens is carried out in said specimen chamber one at a time with respect to a plurality of surfaces of said at least one specimen table;

wherein one specimen table is disposed in a central portion of said specimen chamber and said specimens are held on opposite surfaces of said specimen table.

23. A microwave-excited plasma processing apparatus comprising:

a specimen chamber provided with at least one specimen table for holding at least one specimen thereon;

microwave introducing means of introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said at least one specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region, and plasma treatment of said at least one specimen is carried out in said specimen chamber with respect to a plurality of surfaces of said at least one specimen table;

wherein a plurality of said specimen tables are disposed in opposite to each other on opposite wall sides of said specimen chamber in the direction of a magnetic line of force.

24. A microwave-excited plasma processing apparatus comprising:

a specimen chamber provided with at least one specimen table for holding a plurality of specimens thereon;

microwave introducing means for introducing a microwave into said specimen chamber;

reactive gas introducing means for introducing a reactive gas into said specimen chamber; p1 a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber and plasma treatment of each of said plurality of specimens is carried out in said specimen chamber one at a time with respect to a plurality of surfaces of said at least one specimen table;

wherein a plurality of said specimen tables are disposed in opposite to each other on opposite wall sides of said specimen chamber in the direction of a magnetic line of force.

25. A microwave-excited plasma processing apparatus comprising:

a specimen chamber provided with at least one specimen table for holding at least one specimen thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said at least one specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region, and plasma treatment of said at least one specimen is carried out in said specimen chamber with respect to a plurality of surfaces of said at least one specimen table;

wherein said magnetic field generating means is disposed on opposite surfaces of said at least one specimen table to provide a cusp magnetic line of force configuration.

26. A microwave-excited plasma processing apparatus comprising:

a specimen chamber provided with at least one specimen table for holding a plurality of specimens thereon;
microwave introducing mean for introducing a microwave into said specimen chamber;
reactive gas introducing means for introducing a reactive gas into said specimen chamber;
a vacuum exhaust system for vacuum-exhausting said specimen chamber; and
magnetic field generating means providing a magnetic line of force substantially perpendicular to said at least one specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber and plasma treatment of each of said plurality of specimens is carried out in said specimen chamber one at a time with respect to a plurality of surfaces of said at least one specimen table;
wherein said magnetic field generating means is disposed on opposite surfaces of said at least one specimen table to provide a cusp magnetic line of force configuration.

27. A microwave-excited plasma processing apparatus comprising:
a specimen chamber provided with at least one specimen table for holding at least one specimen thereon;
microwave introducing means for introducing a microwave into said specimen chamber;
reactive gas introducing means for introducing a reactive gas into said specimen chamber;
a vacuum exhaust system for vacuum-exhausting said specimen chamber; and
magnetic field generating means providing a magnetic line of force substantially perpendicular to said at least one specimen table for generating an equivalent flux density surface (ECR surface) for causing an electron cyclotron resonance (ECR), said at lest one specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region, and plasma treatment of said at least one specimen is carried out in said specimen chamber with respect to a plurality of surfaces of said at lest one specimen table;
wherein a plurality of said microwave introducing means are provided in a direction of thickness of said specimen table.

28. A microwave-excited processing apparatus according to claim 27, wherein a plurality of said microwave introducing means are provided in a direction of width of said specimen table.

29. A microwave-excited plasma processing apparatus comprising:
a specimen chamber provided with at least one specimen table for holding a plurality of specimens thereon;
microwave introducing means for introducing a microwave into said specimen chamber;
reactive gas introducing means for introducing a reactive gas into said specimen chamber;
a vacuum exhaust system for vacuum-exhausting said specimen chamber; and
magnetic field generating means providing a magnetic line of force substantially perpendicular to said at least one specimen table for generating an equivalent flux density surface (ECR surface) for causing an electron-cyclotron resonance (ECR), said specimen being processed by using plasma generated at said ECR surface, wherein said microwave is introduced from a direction substantially orthogonal to said magnetic line of force in said specimen chamber and plasma treatment of each of said plurality of specimens is carried out in said specimen chamber one at a time with respect to a plurality of surfaces of said at least one specimen table;
wherein a plurality of said microwave introducing means are provided in a direction of thickness of said specimen table.

30. A microwave-excited processing apparatus according to claim 29, wherein a plurality of said microwave introducing means are provided in a direction of width of said specimen table.

31. A microwave-excited plasma processing apparatus comprising:
a specimen chamber provided with at least one specimen table or holding at least one specimen thereon;
microwave introducing means for introducing a microwave into said specimen chamber;
reactive gas introducing means for introducing a reactive gas into said specimen chamber;
a vacuum exhaust system for vacuum-exhausting said specimen chamber; and
magnetic field generating means providing a magnetic line of force substantially perpendicular to said at least one specimen table for generating an equivalent flux density surface (ECR surface) for causing an electron cyclotron resonance (ECR), said at least one specimen being processed by using plasma generated at said ECR surface, wherein said microwave is introduced from a direction substantially orthogonal to said magnetic line of force so as to propagate in a longitudinal direction of an electronic cyclotron resonance region in said specimen chamber along the ECR surface of the electron cyclotron resonance region, said plasma treatment of said at least one specimen is carried out in said specimen chamber with respect to a plurality of surfaces of said at least one specimen table;
wherein said magnetic field generating means is provided with a coil having a magnetic core.

32. A microwave-excited plasma processing apparatus comprising:
a specimen chamber provided with at least one specimen table or holding a plurality of specimens thereon;
microwave introducing means for introducing a microwave into said specimen chamber;
reactive gas introducing means for introducing a reactive gas into aid specimen chamber;
a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said specimen being processed by using plasma generated at said ECR surface, wherein said microwave is introduced form a direction substantially orthogonal to said magnetic line of force in said specimen chamber and plasma treatment of each of said plurality of specimens is carried out in said specimen chamber one at a time with respect to a plurality of surfaces of said at least one specimen table;

wherein said magnetic field generating means is provided with a coil having a magnetic core.

33. A microwave-excited plasma processing apparatus comprising:

a specimen chamber provided with at least one specimen table for holding at least one specimen thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at leas tone specimen table for generating an equivalent flux density surface (ECR surface) for causing an electron cyclotron resonance (ECR), said at least one specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region, and plasma treatment of said at least one specimen is carried out in said specimen chamber with respect to a plurality of surfaces of said at least one specimen table;

wherein said magnetic field generating means is provided with a cover made of a magnetic material.

34. A microwave-excited plasma processing apparatus comprising:

a specimen chamber provided with at least one specimen table for holding a plurality of specimens thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber and plasma treatment of each of said plurality of specimen is carried out in said specimen chamber one at a time with respect to a plurality of surfaces of said at least one specimen table;

wherein said magnetic field generating means is provided with a cover made of a magnetic material.

35. A microwave-excited plasma processing apparatus comprising:

a specimen chamber provided with at least one specimen table for holding at least one specimen thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said at least one specimen being processed by using plasma generated at said ECR surface, wherein said microwave is introduced from a direction substantially orthogonal to said magnetic line of force so as to propagate in a longitudinal direction of an electron cyclotron resonance region in said specimen chamber along the ECR surface of the electron cyclotron resonance region, and plasma treatment of said at least one specimen is carried out in said specimen chamber with respect to a plurality of surfaces of said at least one specimen table;

wherein when an AC or DC electric field is applied to said at lest one specimen table or said at least one specimen, counter electrodes are respectively provide facing and parallel to the surfaces of said at least one specimen; and wherein each of said counter electrodes is disposed on wall sides of said specimen chamber and is divided into a plurality of segmental parts so that an electric potential applied can be controlled.

36. A microwave-excited plasma processing apparatus comprising:

a specimen chamber provided with at least one specimen table or holding a plurality of specimens thereon;

microwave introducing means for introducing a microwave into said specimen chamber;

reactive gas introducing means for introducing a reactive gas into said specimen chamber;

a vacuum exhaust system for vacuum-exhausting said specimen chamber; and magnetic field generating means providing a magnetic line of force substantially perpendicular to said at least one specimen table for generating an equivalent flux density surface (ECR surface) for causing an electron cyclotron resonance (ECR), said specimen being processed by using plasma generated at said ECR surface, wherein said microwave is introduced from a direction substantially orthogonal to said magnetic line of force in said specimen chamber and plasma treatment of each of said plurality of specimens is carried out in said specimen chamber one at a time with respect to a plurality of surfaces of said at least one specimen table;

wherein when an AC or DC electric field is applied to said at least one specimen table or said plurality of specimens, counter electrodes are respectively provided facing and parallel to the surface of said plurality of specimens; and wherein each of said counter electrodes is disposed on wall sides of said specimen chamber and is divided into a plurality of segmental parts so that an electric potential applied can be controlled.

* * * * *